United States Patent [19]
Ushio et al.

[11] Patent Number: 5,641,597
[45] Date of Patent: Jun. 24, 1997

[54] CIRCUIT FORMING METHOD AND APPARATUS THEREFOR

[75] Inventors: Yoshijiro Ushio, Kawasaki; Tatsuo Niwa, Sakura, both of Japan

[73] Assignee: Nikon Corporation, Tokyo, Japan

[21] Appl. No.: 524,478

[22] Filed: Sep. 7, 1995

[30] Foreign Application Priority Data

Sep. 14, 1994 [JP] Japan .................... 6-244879

[51] Int. Cl.$^6$ .................... G03G 15/14; G03G 13/22
[52] U.S. Cl. .................... 430/31; 430/126
[58] Field of Search .................... 430/31, 46, 126

[56] References Cited

U.S. PATENT DOCUMENTS 4,897,326  1/1990  Marengo .................... 430/49
5,416,569  5/1995  Goldberg .................... 430/126

*Primary Examiner*—John Goodrow
*Attorney, Agent, or Firm*—Shapiro and Shapiro

[57] ABSTRACT

A circuit forming method having the step of forming, on an insulating board or a metallic foil layer, a resist pattern layer for patterning the metallic foil layer to be laminated to the board with a predetermined circuit by means of etching or lift-off, wherein the resist pattern layer forming step comprises the steps of forming an electric field distribution latent image corresponding to the circuit pattern by illuminating a predetermined area on a surface of a photoconductor charged beforehand with light for removing the charge of the surface of the photoconductor, forming a resist image corresponding to the circuit pattern by attaching a resist member charged reversely with respect to the latent image to the latent image, and transferring the resist image to the board or the metallic foil layer as the resist pattern layer.

8 Claims, 5 Drawing Sheets

CIRCUIT FORMING METHOD AND APPARATUS THEREFOR

BACKGROUND OF THE INVENTION

1. Field of the Invention

The present invention relates to a method of forming a circuit such as a printed circuit board and an apparatus therefor.

2. Related Background Art

As advances are made in electronic and visual equipment such as a computer and a video, demand for printed circuit boards is increased and presently, printed circuit boards form a large market accounting for 10% of the whole electronic equipment market. Naturally, demand for printed circuit board forming apparatuses is high.

Usually, a printed circuit board is made by forming a circuit pattern as an electric wiring diagram by means of a good electric conductor such as copper on an insulating board. In order to form the circuit pattern, an additive or subtractive method is utilized. In the additive method, the circuit pattern is formed directly on the board by the use of metallic foil. On the other hand, in the subtractive method, the circuit pattern is formed on the board by coating the board with a metallic foil layer, forming a resist pattern thereon, and removing an area of the metallic foil layer other than the resist pattern by means of etching.

For forming the resist pattern according to the subtractive method, there are mainly an exposure method and a screen printing method. In the exposure method, the resist pattern is formed by coating the board with a photoresist layer, and exposing and developing the photoresist layer via a mask pattern corresponding to the circuit pattern. On the other hand, in the screen printing method, the resist pattern is directly printed through a stencil screen corresponding to the circuit pattern. As the recent trend of the wiring technique, multiple-layer boards have increased in number, and more minute patterns are required. Also, thin and flexible boards have increased in number.

Thus, presently, the screen printing and the lithography by means of the exposure are mainly used to form the resist pattern for forming the circuit pattern of the printed circuit board. However, in the screen printing, its process is simple, but there is still a limit to a pattern width (about 100 µm) and stable formation of the circuit pattern is difficult. Therefore, when a more minute pattern width is required, the lithography is used. However, the number of its processes is large and the photoresist is expensive.

In either way, the mask pattern or the stencil screen (hereinafter referred to as the mask) is required to form the circuit pattern. In this case, the formation of the mask is troublesome. Also, the usage of the mask leads to an increase in the number of inspection processes and an increase in the rate of defective products when the mask has defects. Further, these processes are not necessarily economical when forming a small amount of products.

In view of these problems, it is considered to draw the resist pattern directly without utilizing the mask. For example, a drawing apparatus for scanning and exposing a photoresist with an Ar laser and an apparatus for forming a pattern directly by spraying fine-grained metal are considered. However, problems are still left in terms of throughput and cost. In such a laser scan drawing apparatus, focusing is difficult because of irregularities of the board. Also, the sensitivity of the photoresist is not sufficient, so a high-power laser is required in the drawing and the drawing speed is lowered.

SUMMARY OF THE INVENTION

It is an object of the present invention to provide a circuit forming method by which a resist pattern layer corresponding to a circuit pattern can be formed simply and accurately without a mask.

It is another object of the present invention to provide a circuit forming apparatus capable of forming a resist pattern layer corresponding to a circuit pattern successively, simply, accurately and at high speed without a mask.

In order to achieve the above objects, according to a first aspect of the present invention, there is provided a circuit forming method having the step of forming, on an insulating board or a metallic foil layer, a resist pattern layer for patterning the metallic foil layer to be laminated to the board with a predetermined circuit by means of etching or lift-off, and the method is characterized by that the resist pattern layer forming step comprises the steps of: (a) forming an electric field distribution latent image corresponding to the circuit pattern by illuminating a predetermined area on the surface of a photoconductor charged beforehand with light for removing the charge of the surface of the photoconductor; (b) forming a resist image corresponding to the circuit pattern by attaching a resist member charged reversely with respect to the latent image to the latent image; and (c) transferring the resist image to the board or the metallic foil layer as the resist pattern layer.

Preferably, the resist member is a liquid toner made by dispersing toner grains in a liquid medium, and the method further comprises the step of thermally drying the resist image transferred in the step (c).

Further, preferably, the method comprises the step of forming a resist adhesive layer on the metallic foil layer prior to transferring the resist image.

According to a second aspect of the present invention, there is provided a circuit forming apparatus having means for forming, on an insulating board or a metallic foil layer, a resist pattern layer for patterning the metallic foil layer to be laminated to the board with a predetermined circuit by means of etching or lift-off, and the apparatus is characterized by that the resist pattern layer forming means comprises a photoconductor whose surface can be charged; an exposure optical system for illuminating the surface of the photoconductor with exposure light for removing a charge on the surface; a control unit for controlling the exposure optical system so as to form an electric field distribution latent image corresponding to the circuit pattern by illuminating the surface of the photoconductor charged beforehand with the exposure light based on shape data of the circuit pattern; resist supplying means for attaching a resist member charged reversely with respect to the surface of the photoconductor to the electric field distribution latent image; and transferring means for transferring a resist image attached and formed on the electric field distribution latent image to the board or the metallic foil layer.

Preferably, the transferring means includes an intermediate transfer member disposed such that a resilient surface of the intermediate transfer member can contact the surface of the photoconductor; and pressing means for pressing the surface of the board or the surface of the metallic foil layer against the surface of the intermediate transfer member.

Also, preferably, the apparatus comprises heating means for thermally drying the surface of the intermediate transfer member, the surface of the board, or the surface of the metallic foil layer.

Further, preferably, the apparatus comprises charging means for charging at least the surface of the photoconductor.

The circuit forming method according to the above first aspect of the present invention has the step of forming, on an insulating board or a metallic foil layer, a resist pattern layer for patterning the metallic foil layer to be laminated to the board with a predetermined circuit by means of etching or lift-off. And, in the resist pattern layer forming step, first in the step (a), an electric field distribution latent image corresponding to the circuit pattern is formed by illuminating a predetermined area on the surface of the photoconductor charged beforehand with light for canceling the charge of the surface of the photoconductor. Then, in the step (b), a resist image corresponding to the circuit pattern is formed by attaching a resist member charged reversely with respect to the latent image to the latent image. Thereafter, in the step (c), the resist image is transferred to the board or the metallic foil layer as a resist pattern layer.

That is, for example, when the surface of the photoconductor consisting of a photoelectric conductor is charged positively (negatively) and exposure light is directed to the charged surface of the photoconductor, electric conductivity increases in the exposed portion due to the photoconductivity and the charge of the photoconductor surface is lost. Therefore, when the portion of the charged photoconductor surface other than the portion thereof corresponding to the circuit pattern is illuminated with exposure light, the unexposed and still charged portion corresponding to the circuit pattern forms an electric field distribution latent image. Then, when the negatively (positively) charged resist member is supplied to the photoconductor surface, the resist member is attached to the positively (negatively) charged electric field distribution latent image. As a result, the latent image becomes a visualized resist image. This resist image is the reproduction of the circuit pattern. Therefore, when the resist image is transferred from the photoconductor surface to the metallic foil layer to be patterned (in the case of the etching) or the board (in the case of the patterning by means of the lift-off, prior to laminating the metallic foil layer), a desired resist pattern layer is formed.

Thus, according to the present invention, the resist pattern layer is formed selectively and directly in accordance with the electric field distribution latent image corresponding to the circuit pattern. Therefore, there is no need to utilize a conventional mask, making it possible to omit a trouble of forming the mask. Also, problems occurring due to the usage of the mask can be avoided. Thus, according to the circuit forming method of the present invention, the resist pattern layer can be formed on the board or the metallic foil layer simply, accurately and at high speed.

Anything can be used as the resist member if it can be charged. For example, the resist member may be a toner utilizing a pigment such as a carbon black. In general, grains of a solid powder toner cannot be made so minute and the smallest grain diameter is about 7 μm. Therefore, a minute circuit pattern cannot be reproduced accurately by the use of the solid powder toner. Also, the toner is liable to be attached to an unnecessary portion and liable to be not attached to a portion of the pattern.

On the other hand, in the case of a liquid toner formed by dispersing toner grains in a medium, since the toner grain diameter can be made minute down to, e.g., 1 μm or less, a minute pattern can be reproduced at preferable resolution. Also, sharp and clear pattern edges can be obtained as compared with the powder toner. Further, when such a liquid toner is brought into contact with the photoconductor surface, the toner grains charged in the medium cause electrophoresis due to the surface electric field and are attached to the charged portion of the photoconductor surface (electric field distribution latent image).

When utilizing such a liquid toner as the resist, the toner resist layer transferred to the metallic foil layer can be fixed thereto by heating the toner resist layer to dry the medium. As the heating is effective to enhance the adhesion of the toner resist layer itself to the metallic foil layer, it may be carried out at a temperature higher than a temperature necessary for drying the medium. Also, the heating may be carried out after or at the same time that the toner resist layer is transferred to the metallic foil layer. Otherwise, the board side may be heated immediately before the transfer thereby to heat the toner resist layer after the transfer.

The transfer of the toner resist layer to the board or the metallic foil layer is performed by the contact of the toner resist layer with the board surface or the metallic foil layer in a state where the surface of the board surface or the surface of the metallic foil layer is pressed toward the toner resist layer to a certain extent. At this time, if the toner grains are in a charged state, i.e., in a wet state to a certain extent and the surface of the board surface or the surface of the metallic foil layer is charged reversely with respect to the toner grains, the transfer of the toner resist layer can be performed more speedily and surely because of the electric field suction.

However, differently from printing on a paper with an ordinary toner, in the case of the transfer of the toner resist layer to the metallic foil layer, the soaking of the toner into the metallic foil layer is small. Therefore, in the etching process of the metallic foil layer after the transfer of the toner resist layer, the toner resist layer might be peeled off from the metallic foil layer or etching solution might enter between the toner resist layer and the metallic foil layer.

Therefore, in order to enhance the adhesion of the toner resist layer, it is preferable to form an adhesive layer having adhesion with respect to the resist on the metallic foil layer prior to the transfer of the toner resist layer. It is to be noted that in the etching process, this adhesive layer is etched in a similar manner to the metallic foil layer, and is removed from the metallic foil together with the toner resist left at the time of the development. Also, it is desirable not to make the thickness of the adhesive layer greater than necessary such that the etching time is not lengthened unnecessarily.

Also, the circuit forming apparatus according to the second aspect of the present invention has means for forming, on an insulating board or a metallic foil layer, a resist pattern layer for patterning the metallic foil layer to be laminated to the board with a predetermined circuit by means of etching or lift-off, and the resist pattern layer forming means forms the resist pattern layer as follows. First, an electric field distribution latent image corresponding to the circuit pattern is formed by illuminating the surface of a photoconductor charged beforehand with exposure light by controlling an exposure optical system by means of a control unit based on shape data of the circuit pattern. Next, a resist image is formed by attaching a resist member charged reversely with respect to the photoconductor surface to the electric field distribution latent image by resist supplying means. Then, the resist image is transferred to the board or the metallic foil layer by transferring means.

According to the above-structured apparatus, the resist pattern layer is formed successively in accordance with the electric field distribution latent image corresponding to the circuit pattern without necessitating a mask, and its process is performed simply, accurately and at high speed. Also, the formation of the resist pattern layer can be automated, leading to enhancement of efficiency of the whole circuit forming process.

When the resist image, i.e., the resist pattern layer is transferred to the board or the metallic foil layer, the photoconductor surface may be brought into direct contact with the surface to be transferred. However, if the contact is carried out in a pressed state to a certain degree, the photoconductor surface might be scratched and the transfer could not be performed efficiently. This problem can be solved by transferring the resist pattern layer via an intermediate transfer member with a resilient surface.

Now, such a mechanism of the present invention constituted of a photoconductor drum and a roller-shaped intermediate transfer member will be described with reference to FIG. 5. In the apparatus of FIG. 5, first, shape data of a circuit pattern formed in advance by a CAD or the like is sent to a control unit 100 as electronic information. The electronic information is converted by the control unit 100 into an optical modulation signal.

An exposure optical system consisting of an exposure light source 101 and a condensing optical system 102 is controlled by the optical modulation signal output from the control unit 100. Light from the exposure light source 101 illuminates the surface of a photoconductor drum 104 via the condensing optical system 102. The surface of the photoconductor drum 104 is charged beforehand. In accordance with the on and off of the exposure light corresponding to the output from the control unit 100, the scanning of a light spot 103 and the rotation (115) of the photoconductor drum 104, the charge of an area of the surface of the photoconductor drum 104 other than an area thereof corresponding to the circuit pattern is lost. As a result, the unexposed and still charged area forms an electric field distribution latent image.

As the photoconductor drum 104 with the electric field distribution latent image formed thereon is further rotated (115), a resist member (a liquid toner) charged reversely with respect to the latent image is supplied from a resist supply section 105. Thereby, toner grains are attached to the electric field distribution latent image to form a toner resist image.

A roller-shaped intermediate transfer member 108 with a resilient surface is disposed such that the axis of rotation thereof is parallel to the axis of rotation of the photoconductor drum 104 and their surfaces contact linearly. Actually, the surface of the intermediate transfer member 108 is in contact with that of the photoconductor drum 104 in a slightly pressed state in accordance with the resiliency thereof, so that the contact area has a certain degree of width. The rotation (116) of the intermediate transfer member 108 is interlocked with the rotation (115) of the photoconductor drum 104. As the intermediate transfer member 108 and the photoconductor drum 104 are rotated, the toner resist image on the surface of the photoconductor drum 104 is transferred to the surface of the intermediate transfer member 108.

At this time, if the toner resist is in a charged state as in the case of utilizing the liquid toner, and if the surface of the intermediate transfer member 108 is charged reversely with respect to the toner resist, the toner resist can be transferred from the surface of the photoconductor 104 to the surface of the intermediate transfer member 108 comparatively easily and with preferable adhesion due to the electric field suction.

When the toner resist image is transferred to the surface of the intermediate transfer member 108, a board to be printed 110 is fed in accordance with the advance of a feed stage 109 by means of a feed roller 111 (in the direction indicated by an arrow 119) and the rotation (116) of the intermediate transfer member 108 while the board to be printed 110 is pressed by the intermediate transfer member 108. Consequently, the toner resist image is transferred onto the board to be printed 110 as a resist pattern layer 113. In the case of patterning the metallic foil layer by means of etching, the board to be printed 110 onto which the resist image is transferred is in a state where the metallic foil layer is already laminated to the insulating board. Namely, the resist image is transferred onto the metallic foil layer.

Also, in the case of patterning the metallic foil layer by means of lift-off, the board to be printed 110 onto which the resist image is transferred is in a state before the metallic foil layer is laminated to the insulating board. The resist image is transferred onto the insulating board and thereafter, the metallic foil layer is laminated to the resist pattern layer 113. Then, a circuit pattern is formed by removing the resist pattern layer 113 and the metallic foil on the resist pattern layer 113. Therefore, in the case of the patterning by means of lift-off, the resist image, i.e., the electric field distribution latent image is the reverse image of the circuit pattern.

Thus, when the resist pattern layer is transferred from the surface of photoconductor onto the board or the metallic foil layer via the intermediate transfer member with the resilient surface in the pressed state, there is no danger that the surfaces of the photoconductor and the metallic foil layer are scratched, thanks to the resiliency of the surface of the intermediate transfer member. Also, the contact between the respective transfer contact surfaces becomes surely and the transfer efficiency is improved.

Also, if heating means such as a heater 114 as shown in FIG. 5 is provided, a process of drying and fixing the toner on the board or the metallic foil layer can be carried out successively. Thereby, the circuit forming process can be more automated and the efficiency of the whole process is improved. The heating is not limited to the heating from the board to be printed side, as shown in FIG. 5, and may be heating between the surface of the photoconductor or the surface of the intermediate transfer member and the surface of the board or the surface of the metallic foil layer, or heating to the resist pattern layer transferred to the metallic foil layer. As the heating means, in addition to the heater and hot air blowing, a ceramic heater may be utilized to heat the board by the direct contact.

Further, if the charging means such as voltage applying means 106 for generating corona discharge as shown in FIG. 5 is provided, the operation of charging the surface of the photoconductor can be automated as a sequential process, making it possible to achieve high efficiency of the whole circuit forming process. Similarly, it is effective to provide charging means when charging the surface of the intermediate transfer member, the surface of the board or the surface of the metallic foil layer, as a transfer applying voltage 112 in FIG. 5. In addition to the corona discharge, the charging means may be a mechanism which brings the member to be charged into contact with a charged body.

Also, after the resist image is transferred, if necessary, the surface of the photoconductor or the surface of the intermediate transfer member is subjected to cleaning, e.g., in a wiping method. The photoconductor is discharged before the exposure of the following process. These operations after the transfer may be automated as a sequential process by providing cleaning means and discharging means (e.g., a discharging electrode 107 in FIG. 5).

The light source for forming the latent image may be a solid-state laser such as a semiconductor laser or a gas laser such as a He-Ne laser. In the case of the gas laser, generally, optical modulation (on and off) is performed by the use of an optical modulator of some kind (EO, AO). Also, a line light source such as an LED, an EL or a fluorescent character display tube may be utilized in addition to the laser scan system.

The above and other objects, features and advantages of the present invention will be explained hereinafter and may be better understood by reference to the drawings and the descriptive matter which follows.

DETAILED DESCRIPTION OF THE PREFERRED EMBODIMENTS (First Embodiment)

Figure 1A:
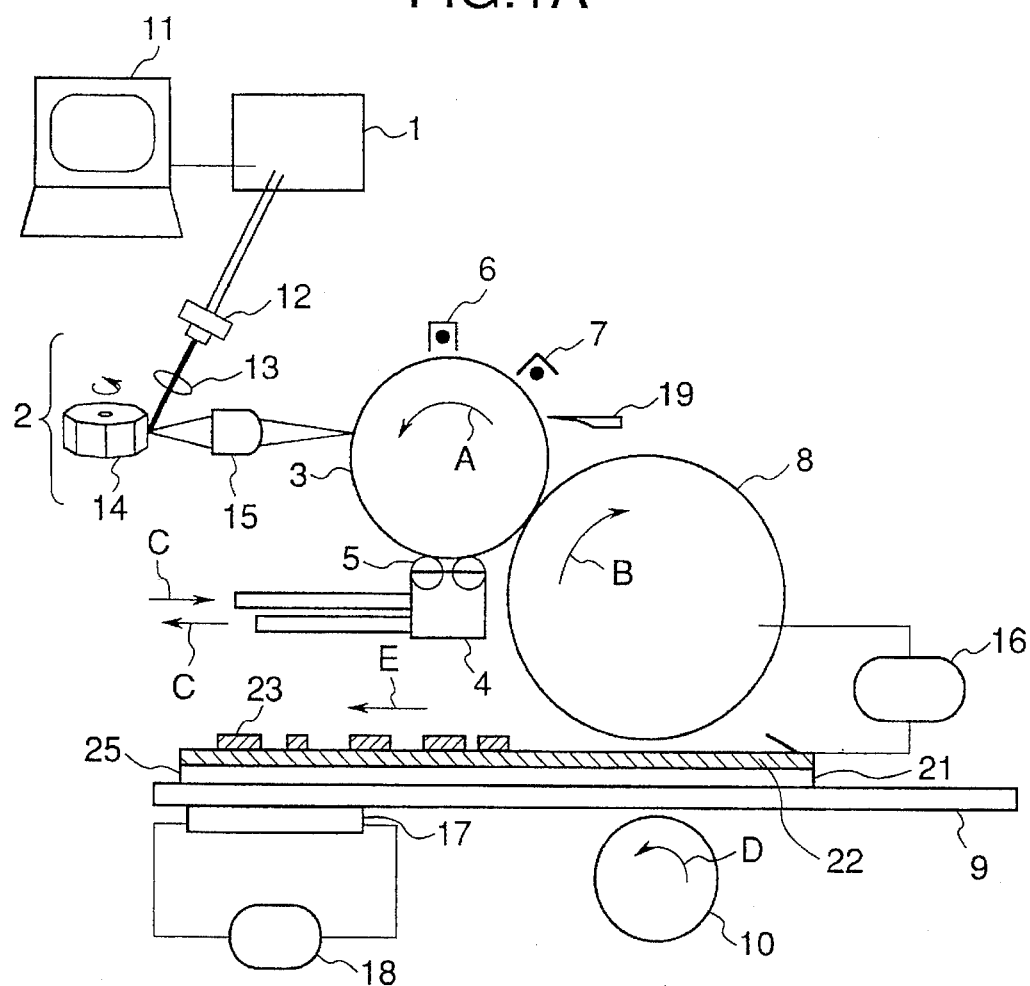
FIG. 1A is a schematic diagram showing a circuit forming apparatus according to a first embodiment of the present invention.

FIG. 1A shows a circuit forming apparatus according to a first embodiment of the present invention for forming a resist pattern layer from an electric field distribution latent image formed on the surface of a photoconductor by the use of a semiconductor layer (wavelength: 680 nm) of an exposure light source.

The apparatus has a controller 1 as a control unit connected to a computer 11, an exposure optical system 2, a photoconductor drum 3, a toner developing case 4 as resist supplying means, a rubber roller 8 as an intermediate transfer member, a feed roller 10 for feeding a feed stage 9 with a board to be printed 25 disposed thereon in a feeding direction and a ceramic heater 17 as heating means.

The exposure optical system 2 consists of a semiconductor laser 12 of an exposure light source, a collimator lens 13, a polygon mirror (octagon) 14 of scanning means of laser light, an f·θ lens 15 as a condensing optical system. The resolution of exposure is 1,200 dpi (1,200 dots/inch).

The photoconductor drum 3 has an about 30 μm thick photoconductor surface formed of amorphous-Si (amorphous silicon, hereinafter referred to as a-Si) and is in the shape of a cylinder. The diameter of the photoconductor drum 3 is about 40 mm. The photoconductor drum 3 is provided with a charging electrode 6 for applying high voltage as charging means. The toner developing case 4 is connected to an external toner reservoir (not shown) storing a liquid toner as a resist member therein. The liquid toner in the external toner reservoir is supplied to the toner developing case 4 so as to circulate (arrow C) by means of a pump (not shown). The toner developing case 4 is provided on its upper portion with two rollers 5. The two rollers 5 are rotated, and the liquid toner attached and swollen on surfaces of the rollers 5 is brought into contact with the surface of the photoconductor drum 3. The distance between the rollers 5 and the photoconductor surface is set to about 100 μm. Also, the rubber roller 8 as the intermediate transfer member has a diameter of about 70 mm and is in the shape of a cylinder. The axis of rotation of the rubber roller 8 is parallel to the axis of rotation of the photoconductor drum 3.

The liquid toner of this embodiment is made by dispersing a black pigment, a resin material for surrounding the black pigment, and an additive called a charge control member for controlling charges of the grains, into an isoper (trade name: isoparaffin hydrocarbon) of an organic solvent. The toner grain diameter is about 0.8 μm and the toner grains are charged positively in the solvent.

In the above structure, first, shape data of a circuit pattern formed by drawing software of the computer 11 is sent to the controller 1 as a serial signal. The exposure optical system 2 is controlled by an output from the controller 1 corresponding to the circuit pattern information. Laser light emitted from the semiconductor laser 12 is made parallel light with proper light flux diameter by means of the collimator lens 13, reflected by a reflecting mirror of the polygon mirror 14, and condensed on the surface of the photoconductor drum 3 via the f·θ lens 15.

The laser light is scanned by the rotation of polygon mirror 14 in the direction of the rotation axis of the photoconductor drum 3 while the on and off of the semiconductor laser 12 is controlled by the signal from the controller 1. After the photoconductor surface is charged negatively by the charging electrode 6 as the photoconductor drum 3 is rotated (in the direction indicated by the arrow A), it is exposed to the scanning laser light. Further rotation of the drum causes an area discharged due to the exposure and an unexposed and still charged area to be formed on the photoconductor surface, sequentially forming an electric field distribution latent image corresponding to the circuit pattern.

As the drum is further rotated, the photoconductor surface with the electric field distribution latent image formed thereon passes on the rollers 5 of the toner developing case 4. At this time, the positively charged liquid toner on the rollers 5 is attached to the electric field distribution latent image as the result of electrophoresis, whereby a toner resist image is formed. The rotation of the photoconductor drum 3 is interlocked with that of the rubber roller 8. As the photoconductor drum 3 is further rotated, the toner resist image is transferred from the surface of the photoconductor drum 3 to the surface of the rubber roller 8 owing to the linear contact between those surfaces.

As the photoconductor drum 3 is further rotated, an area of the photoconductor surface where the toner resist image has been transferred to the surface of the rubber roller 8 is sequentially subjected to cleaning by means of a squeegee cleaner 19, and thereafter discharged by the discharging electrode 7.

Under the rubber roller 8, the feed table 9 with the board to be printed 25 disposed thereon is fed by rotation of the feed roller 10 (in the direction indicated by the arrow D) in the direction indicated by the arrow E. The board to be printed 25 has a thickness of about 1 mm and is formed by coating an epoxy resin board 21 with a copper foil 22. In this embodiment, a voltage applying controller 16 is provided for charging the copper surface. An electric field for charging negatively is applied (about 500 V) by the voltage applying controller 16 through the copper surface.

As the rubber roller 8 is further rotated (in the direction indicated by the arrow B), the toner resist image on the photoconductor surface is sequentially transferred to the surface of the rubber roller 8 at its contact portion with the photoconductor surface. When the rubber roller 8 is further rotated, and as soon as its area where the toner resist image is transferred reaches the lower portion of the rubber roller 8, the board to be printed 25 whose copper surface is charged negatively by the voltage applying controller 16 is fed under the rubber roller 8 in accordance with the advance of the feed table 9.

At this time, the toner on the surface of the rubber roller 8 is still wet and charged positively. Therefore, when the toner faces the negatively charged copper surface, it is attached to the copper surface. Namely, as the rubber roller 8 is rotated the board to be printed 25 is fed, the toner resist image is transferred to the board to be printed 25, forming a resist pattern layer 23 corresponding to the circuit pattern.

In this embodiment, the ceramic heater 17 as the heating means is provided under the feed stage 9. When the board to be printed 25 with the resist pattern layer 23 transferred thereon is fed over the heater 17, the heater 17 immediately heats the board to be printed 25 through the feed stage 9 by means of a heater controller 18. Owing to this heating, the resist pattern layer 23 on the board to be printed 25 is dried and fixed to the copper surface thereof.

Next, after a portion of the copper foil 22 on which the resist pattern layer 23 is not formed is etched by ferric chloride of etching solution for the copper foil, the resist layer is removed by organic solvent such as acetone. The etching of the metallic foil may be dry etching other than the wet etching, and it is preferable to select a proper etching method in accordance with metal and a resist member to be used.

According to the above process, a printed circuit board was actually obtained by the use of the apparatus in this embodiment. As a result, the minimum line width of the circuit was about 50 μm. Also, the time for forming a resist pattern from the exposure to the drying and fixing was about 30 sec. with respect to a 500 mm×600 mm board to be printed.

Thus, according to the apparatus of this embodiment, the circuit can be formed easily, at high speed and successively. Therefore, a large number of printed circuit boards can be manufactured successively by the use of the same pattern for a short period of time, contributing to high efficiency of throughput and low manufacturing cost. Also, even in the case of manufacturing a small number of printed circuit boards for each different pattern, there is no need to make a mask for each different pattern, and each different pattern can be obtained easily by switching pattern shape data. Therefore, one apparatus can comply with various circumstances easily.

Figure 1B:
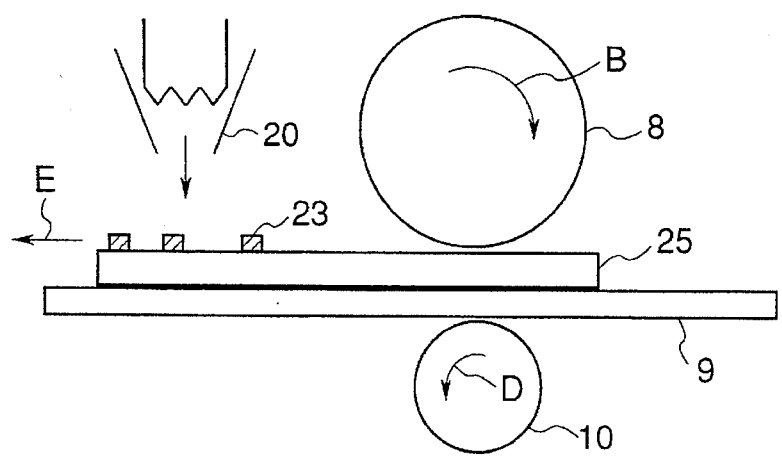
FIG. 1B is an explanatory diagram showing another example of heating means in FIG. 1A.

In the above apparatus, although the ceramic heater 17 is provided under the feed stage 9 as the heating means so as to thermally dry the toner on the board to be printed via the feed stage 9, the present invention is not limited thereto. For example, as shown in FIG. 1B (elements other than the rubber roller 8, the feed stage 9 and the feed roller 10 are omitted), a hot air blowing mechanism 20 may be provided over the feed stage 9 to blow hot air for thermal drying. Also, when transferring the toner resist image from the rubber roller 8 to the board to be printed 25, the transfer may be carried out with the surface of the copper foil 22 pressed against the surface of the rubber roller 8 by providing pressing means as now described with reference to FIG. 2 (a feed roller is used also as a pressure roller in FIG. 2).

(Second Embodiment)

Figure 2:
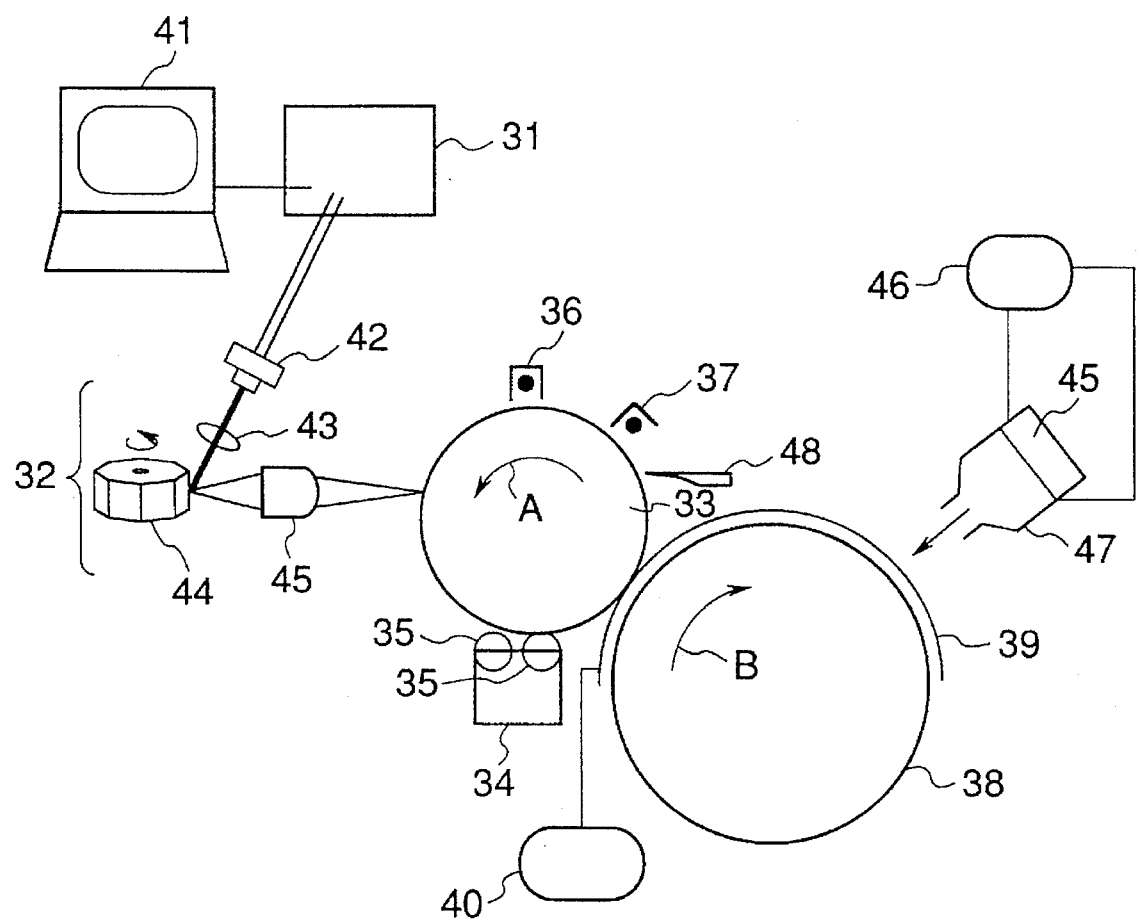
FIG. 2 is a schematic diagram showing a circuit forming apparatus according to a second embodiment of the present invention.

FIG. 2 shows a circuit forming apparatus according to a second embodiment of the present invention similar to the apparatus according to the first embodiment, wherein a resist pattern layer is formed on a flexible board to be printed by transferring a toner resist image directly from a photoconductor to the flexible board to be printed.

The apparatus has a controller 31 as a control unit connected to a computer 41; an exposure optical system 32; a photoconductor drum 33; a toner developing case 34 as resist supplying means; a rubber roller 38 as one of means for feeding a board to be printed 39 (though it is utilized as the intermediate transfer member in the first embodiment); and a hot air blowing mechanism 47 (a heat source is a ceramic heater 45) as heating means.

Similarly to the first embodiment, the exposure optical system 32 consists of a semiconductor laser 42 of an exposure light source, a collimator lens 43, a polygon mirror (octagon) 44 of scanning means of laser light, and an f·θ lens 45 as a condensing optical system. The resolution of exposure is 1,200 dpi (1,200 dots/inch).

Also, the photoconductor drum 33 has an about 30 μm thick a-Si photoconductor surface and is in the shape of a cylinder. The diameter of the photoconductor drum 33 is about 40 mm. The photoconductor drum 33 is provided with a charging electrode 36 for applying high voltage as charging means. Similarly to the first embodiment, the toner developing case 34 is connected to an external toner reservoir (not shown) storing a liquid toner as a resist member therein. The liquid toner in the external toner reservoir is supplied to the toner developing case 34 so as to circulate by means of a pump (not shown). The toner developing case 34 is provided on its upper portion with two rollers 35. The two rollers 35 are rotated, and the liquid toner attached and swollen on surfaces of the rollers 35 is brought into contact with the surface of the photoconductor drum 33.

Also, the rubber roller 38 has a diameter of about 70 mm and is in the shape of a cylinder. The axis of rotation of the rubber roller 38 is parallel to the axis of rotation of the photoconductor drum 33. The flexible board to be printed 39 is fixed to the surface of the rubber roller 38 by means of a suction chuck (not shown).

The flexible board to be printed 39 has a thickness of about 150 μm and is formed by coating a polyimido film with a copper foil. Also, the same liquid toner as in the first embodiment is utilized as a resist member.

In the above structure, first, shape data of a circuit pattern formed by drawing software of the computer 41 is sent to the controller 31 as a serial signal. The exposure optical system 32 is controlled by an output from the controller 31 corresponding to the circuit pattern information. Laser light emitted from the semiconductor laser 42 is made parallel light with proper light flux diameter by means of the collimator lens 43, reflected by a reflecting mirror of the polygon mirror 44, and condensed on the surface of the photoconductor drum 33 via the f·θ lens 45.

The laser light is scanned by the rotation of polygon mirror 44 in the direction of the rotation axis of the photoconductor drum 33 while the on and off of the semiconductor laser 42 is controlled by the signal from the controller 31. After the photoconductor surface is charged negatively by the charging electrode 36 as the photoconductor drum 33 is rotated (in the direction indicated by the arrow A), it is exposed to the scanning laser light. Further rotation of the drum causes an area discharged due to the exposure and an unexposed and still charged area to be formed on the photoconductor surface, sequentially forming an electric field distribution latent image corresponding to the circuit pattern.

As the photoconductor drum 33 is further rotated, the photoconductor surface with the electric field distribution latent image formed thereon passes on the rollers 35 of the toner developing case 34. At this time, the positively charged liquid toner on the rollers 35 is attached to the electric field distribution latent image as the result of electrophoresis, whereby a toner resist image is formed.

The rotation of the photoconductor drum 33 is interlocked with that of the rubber roller 38. As soon as the toner resist image formed on the photoconductor drum 33 reaches a contact portion between the surface of the photoconductor drum 33 and the surface of the rubber roller 38 in accordance with rotation of both the photoconductor drum 33 and the rubber roller 38, the copper surface of the flexible board to be printed 39 is charged negatively by a voltage applying controller 40, and the flexible board to be printed 39 is advanced to the contact portion while it is sucked and fixed to the surface of the rubber roller 38. At the contact portion, the positively charged toner is attached and transferred to the negatively charged copper surface on the flexible board to be printed 39. Further rotation causes the toner resist image to be transferred to the flexible board to be printed 39, forming a resist pattern layer thereon.

As the photoconductor drum 33 is further rotated, an area of the photoconductor surface where the toner resist image has been transferred to the surface of the flexible board to be printed 39 is sequentially subjected to cleaning by means of a squeegee cleaner 48, and thereafter discharged by a discharging electrode 37.

As the rubber roller 38 is further rotated, an area on the surface of the rubber roller 38 to which the toner resist image has been transferred is sequentially heated by hot air from the hot air blowing mechanism 47 controlled by a heater controller 46. As a result, the toner is dried and fixed on the copper surface on the flexible board to be printed 39 as the resist pattern layer.

After the heating and fixing, etching and toner removing processes are conducted to obtain a flexible printed circuit board in the same manner as in the first embodiment. According to the second embodiment, a flexible printed circuit board was actually formed. As a result, it was possible to obtain approximately the same line width of the circuit pattern as that of the circuit pattern in the first embodiment. The system of directly transferring the resist image from the photoconductor to the flexible board to be printed side in the second embodiment can be realized by the use of the apparatus of the first embodiment (FIG. 1A), though slight change of feeding path is necessary.

Although the resist pattern layer is formed directly on the metallic foil layer of the board to be printed in the above first and second embodiments, it is preferable to laminate a substance with adhesion to the metallic foil layer prior to transferring the resist image to the board to be printed in order enhance adhesion between the metallic foil layer and the resist.

Figure 3A:
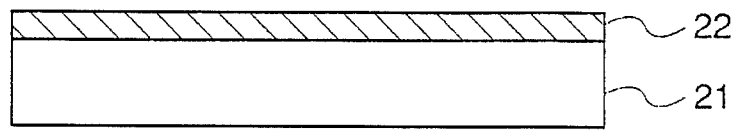
FIGS. 3A to 3E are explanatory diagrams showing the process of forming a resist pattern layer when an adhesive layer is provided on a board to be printed.
Figure 3B:
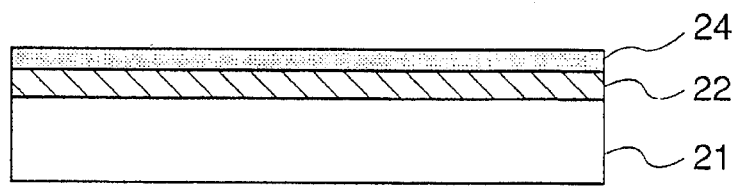

Hereinafter, a description is given of a resist layer forming process and a copper foil etching process by providing an adhesive layer on a board to be printed formed by coating an epoxy resin board with a copper foil, with reference to FIGS. 3A to 3E. First, an epoxy resin board 21 is coated with a copper foil 22 (FIG. 3A). Next, an adhesive layer 24 is laminated onto the copper foil 22 (FIG. 3B).

Figure 3C:
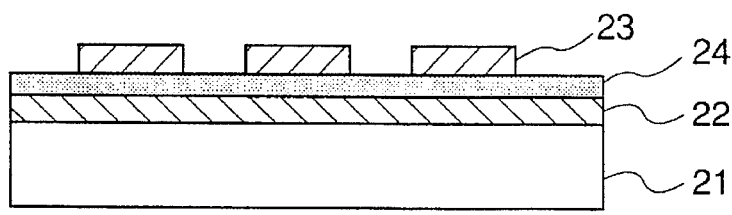
Figure 3D:
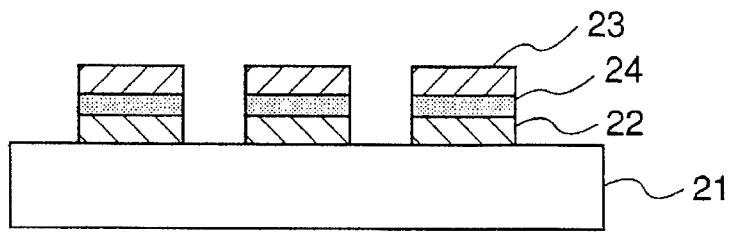
Figure 3E:
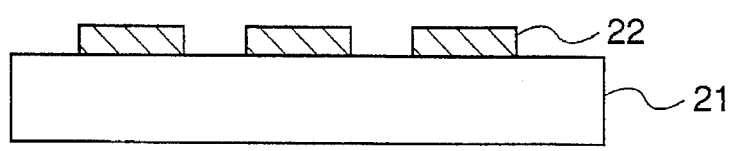

The board to be printed with the adhesive layer 24 formed on the surface thereof is fed into the circuit forming apparatus to transfer and fix a resist pattern layer 23 formed by an electric field distribution latent image corresponding to a circuit pattern to the adhesive layer 24 (FIG. 3C). Thereafter, etching is performed by copper foil etching solution (FIG. 3D), and the resist pattern layer 23 and the adhesive layer 24 are removed (FIG. 3E). In the etching process, the resist pattern layer 23 is tightly bonded to the copper foil 22 by means of the adhesive layer 24. Therefore, the resist pattern layer 23 will not be peeled off from the copper foil 22 and the etching solution will not enter between both layers, so that the etching can be performed with high accuracy.

The adhesive layer forming process may be automated by providing adhesive layer forming means on the feeding path of the apparatus. As the adhesive substance, for example, when the smoothness of the surface of the metallic foil layer is bad and the toner is hard to be attached thereto, it is considered to utilize metal such as Al with a comparatively smooth surface or resin. Also, an adhesive layer into which the liquid toner soaks to some extent may be effective. In that case, it is preferable to utilize a porous film with a large number of porosities. As the adhesive material, any metal and organic matter may be usable if they have adhesion with respect to the metallic foil layer and are easy to be etched together with the metallic foil.

Although the patterning of the metallic foil layer is performed by etching, the apparatuses in both embodiments can also form the resist pattern layer for patterning by means of lift-off easily and speedily. A point different from etching is that an electric field distribution latent image formed on the photoconductor surface is a reverse image to the circuit pattern. That is, a resist image corresponds to an area on the photoconductor surface other than the area of the circuit pattern, and the board is printed before the metallic foil layer is laminated thereto.

Now, a lift-off process will be described with reference to FIGS. 4A to 4C, correspondingly to the first embodiment. As the rubber roller 8 is rotated, a toner resist image formed on an electric field distribution latent image (the reverse image to the circuit pattern) on the photoconductor surface is transferred to the surface of the rubber roller 8 at the contact portion between the surface of the rubber roller 8 and the photoconductor surface. Thereafter, as soon as the area of the toner resist image reaches the lower portion of the rubber roller 8 due to further rotation of the rubber roller 8, the epoxy resin board 21 is fed under the rubber roller 8 as the feed table 9 is advanced.

Figure 4A:
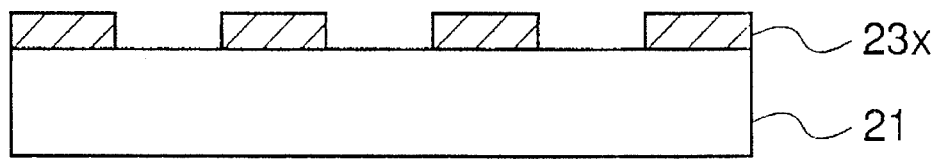
FIGS. 4A to 4C are explanatory diagrams showing a lift-off process.
Figure 4B:
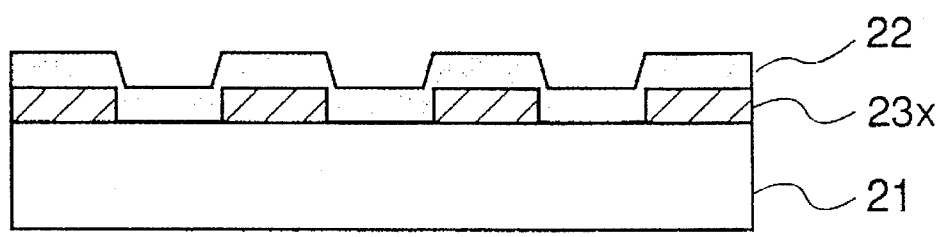
Figure 4C:
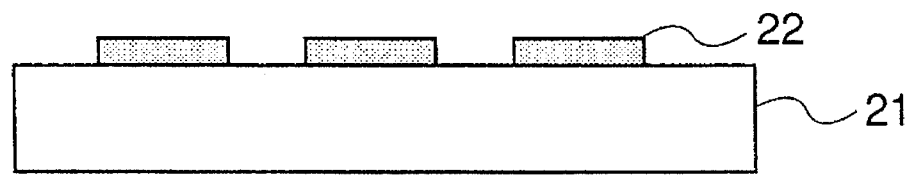
Figure 5:
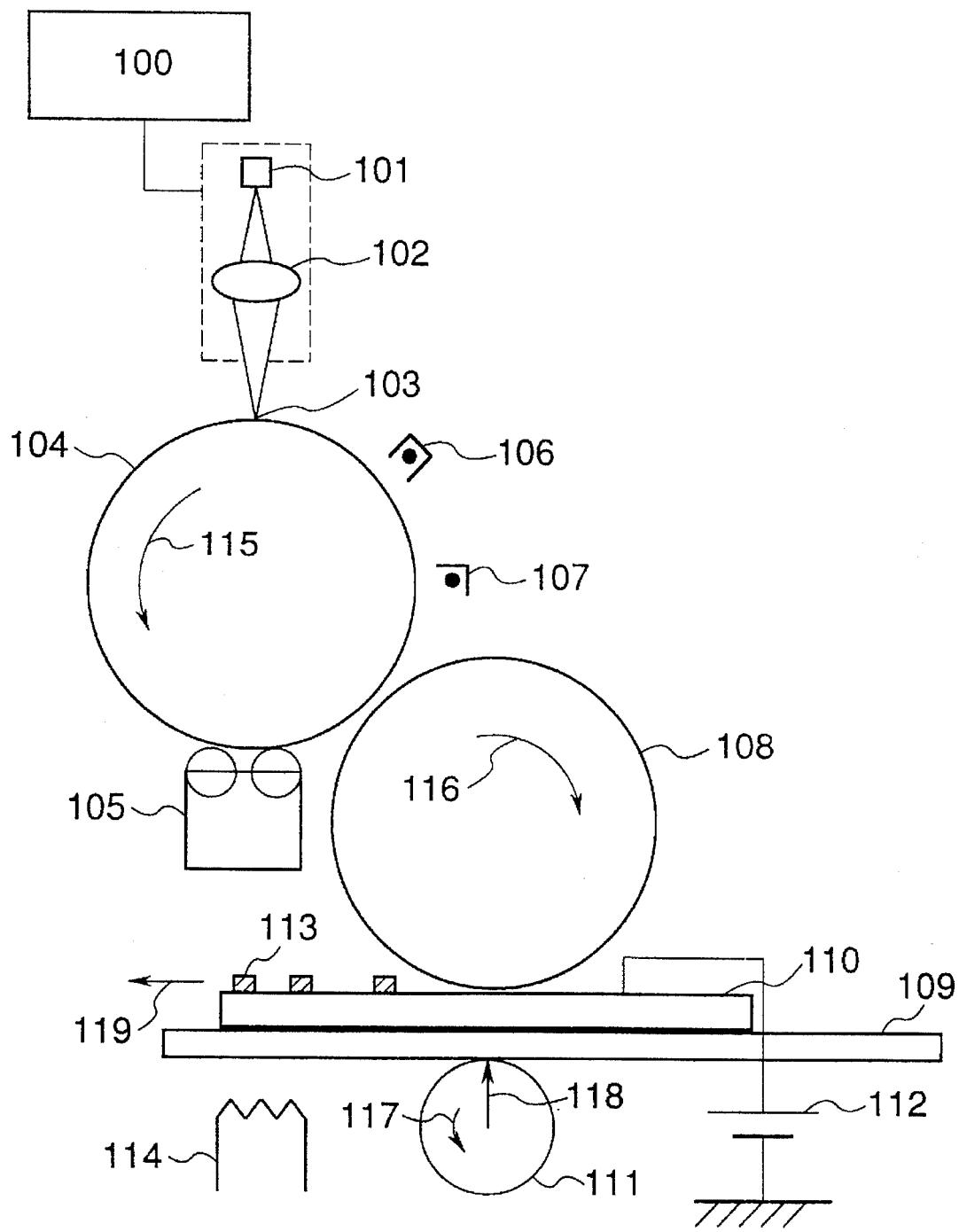
FIG. 5 is an explanatory diagram for explaining the operation of the circuit forming apparatus according to the present invention.

As the rubber roller 8 is further rotated and the epoxy resin board 21 is further advanced, the toner resist image is transferred to the epoxy resin board 21, dried and fixed thereto, thereby forming a resist pattern layer 23x corresponding to the reverse image of the circuit pattern (FIG. 4A). The whole surface of the epoxy resin board 21 with the resist pattern layer 23x formed thereon is coated with the copper foil 22 (FIG. 4B). Then, the resist pattern layer 23x is removed together with the copper foil on the resist pattern layer 23x. The left copper foil after this lift-off process is a formed circuit pattern.

Also, the photoconductor surface is formed of the a-Si in the above embodiments, but may be formed of an OPC (organic photoconductor) such as a two-layer-structured material having a charge generating layer of azophthalocyanine or pyrylium and a charge transmitting layer of hydrazine or styryl, or a material with photoconductivity such as selenium, titanium oxide or zinc oxide.

Also, although the toner is used as the resist member in the above embodiments, basically, it may be grains which have charge controlling portions and can work as a resist. Such grains are mostly represented by resin grains. In the case of performing the patterning by means of the etching, naturally, the resist member needs not to be affected by the etching solution. Also, in the case of performing the patterning by means of the lift-off, only the resist member needs to be removed from the board. Therefore, it is necessary to take into consideration the material of the toner for the etching method or the lift-off method selected in accordance with the metallic foil and the insulating board to be used.

As described above, according to the method of the present invention, a resist pattern layer for a circuit on a board to be printed can be formed in a simple process without a mask. This is advantageous in that cost and trouble of making a mask are omitted. In particular, when utilizing the liquid toner as the resist member, it is possible to form an accurate pattern with sharp and clear edges, and a desired circuit pattern can be reproduced at high resolution with precision.

Also, according to the apparatus of the present invention, the process of forming a resist pattern layer for a circuit on a board to be printed can be performed in a simple structure successively, at high speed and with high accuracy without using a mask. In particular, when a resist image is transferred from the photoconductor to the surface of the board to be printed via the intermediate transfer member having resiliency, the photoconductor surface will not be scratched and the transfer efficiency are improved. Therefore, the apparatus can be used continuously for a long time while its accuracy is maintained.

Also, the circuit pattern can be changed merely by changing its shape data, so that it is effective to form a small number of printed circuit boards for each of various types of circuit patterns. As compared with a direct laser drawing system necessitating no mask, this system is superior in that a resist developing process is unnecessary, the light source for drawing may be one generating low energy, the drawing can be carried out at high speed, and the apparatus is inexpensive.

Further, there is no need to use a resist developing solution, and in patterning, the resist is consumed not in vain but for a necessary amount, so that the apparatus is economical. Furthermore, wastes can be reduced to a minimum, requiring less consideration of their recovery and disposal.

What is claimed is:

1. A circuit forming method having the step of forming, on an insulating board or a metallic foil layer, a resist pattern layer for patterning said metallic foil layer to be laminated to said board with a predetermined circuit by means of etching or liftoff, wherein said resist pattern layer forming step comprises the steps of:

(a) forming an electric field distribution latent image corresponding to said circuit pattern by illuminating a predetermined area on a surface of a photoconductor charged beforehand with light for removing the charge of said surface of said photoconductor;

(b) forming a resist image corresponding to said circuit pattern by attaching a resist member charged reversely with respect to said latent image to said latent image; and (c) transferring said resist image to said board or said metallic foil layer as said resist pattern layer.

2. A circuit forming method according to claim 1, wherein said resist member is a liquid toner made by dispersing toner grains in a liquid medium, said method further comprising the step of thermally drying said resist image transferred in said step (c).

3. A circuit forming method according to claim 1, further comprising the step of forming a resist adhesive layer on said metallic foil layer prior to transferring said resist image.

4. A circuit forming apparatus having means for forming, on an insulating board or a metallic foil layer, a resist pattern layer for patterning said metallic foil layer to be laminated to said board with a predetermined circuit by means of etching or lift-off, wherein said resist pattern layer forming means comprises:

a photoconductor whose surface can be charged;

an exposure optical system for illuminating said surface of said photoconductor with exposure light for removing a charge on said surface;

a control unit for controlling said exposure optical system so as to form an electric field distribution latent image corresponding to said circuit pattern by illuminating said surface of said photoconductor charged beforehand with said exposure light based on shape data of said circuit pattern;

resist supplying means for attaching a resist member charged reversely with respect to said surface of said photoconductor to said electric field distribution latent image; and transferring means for transferring a resist image attached and formed on said electric field distribution latent image to said board or said metallic foil layer.

5. A circuit forming apparatus according to claim 4, wherein said transferring means includes:

an intermediate transfer member disposed such that a resilient surface of said intermediate transfer member can contact said surface of said photoconductor; and pressing means for pressing a surface of said board or a surface of said metallic foil layer against said surface of said intermediate transfer member.

6. A circuit forming apparatus according to claim 4, further comprising heating means for thermally drying said surface of said intermediate transfer member, said surface of said board, or said surface of said metallic foil layer.

7. A circuit forming apparatus according to claim 4, further comprising charging means for charging at least said surface of said photoconductor.

8. A circuit forming method according to claim 1, further comprising etching said metallic foil layer to remove said metallic foil layer from said board except where said resist image is formed, or lifting off said metallic foil layer from said board only where said resist image is formed.

* * * * *